(12) United States Patent
Cai et al.

(10) Patent No.: US 10,355,086 B2
(45) Date of Patent: Jul. 16, 2019

(54) HIGH DOPED III-V SOURCE/DRAIN JUNCTIONS FOR FIELD EFFECT TRANSISTORS

(71) Applicants: International Business Machines Corporation, Armonk, NY (US); GlobalFoundries, Inc., Grand Cayman (KY); STMicroelectronics, Inc., Coppell, TX (US)

(72) Inventors: Xiuyu Cai, Niskayuna, NY (US); Qing Liu, Watervliet, NY (US); Kejia Wang, Harrison, NY (US); Ruilong Xie, Schenectady, NY (US); Chun-Chen Yeh, Clifton Park, NY (US)

(73) Assignees: INTERNATIONAL BUSINESS MACHINES CORPORATION, Armonk, NY (US); GLOBALFOUNDRIES, INC. (KY); STMICROELECTRONICS, INC., Coppell, TX (US)

( * ) Notice: Subject to any disclaimer, the term of this patent is extended or adjusted under 35 U.S.C. 154(b) by 35 days.

(21) Appl. No.: 15/181,843

(22) Filed: Jun. 14, 2016

(65) Prior Publication Data

US 2017/0033197 A1    Feb. 2, 2017

Related U.S. Application Data

(62) Division of application No. 14/812,425, filed on Jul. 29, 2015.

(51) Int. Cl.
*H01L 21/84* (2006.01)
*H01L 29/10* (2006.01)
(Continued)

(52) U.S. Cl.
CPC .... *H01L 29/1033* (2013.01); *H01L 21/30621* (2013.01); *H01L 29/1054* (2013.01);
(Continued)

(58) Field of Classification Search
CPC ......... H01L 21/30621; H01L 29/66546; H01L 29/66636; H01L 29/66522; H01L 29/6656;
(Continued)

(56) References Cited

U.S. PATENT DOCUMENTS 8,853,010 B2 * 10/2014 Park ................. H01L 29/66545
257/E21.411
8,866,188 B1 * 10/2014 Tsai ................. H01L 29/66795
257/190
(Continued)

OTHER PUBLICATIONS

Cai, Xiuyu, et al.; "High Doped III-V Source/Drain Junctions for Field Effect Transistors"; U.S. Appl. No. 14/812,425, filed Jul. 29, 2015.
(Continued)

*Primary Examiner* — Daniel Whalen
(74) *Attorney, Agent, or Firm* — Cantor Colburn LLP; Steven Chiu

(57) ABSTRACT

A semiconductor device includes a fin patterned in a substrate; a gate disposed over and substantially perpendicular to the fin; a pair of epitaxial contacts including a III-V material over the fin and on opposing sides of the gate; and a channel region between the pair of epitaxial contacts under the gate comprising an undoped III-V material between doped III-V materials, the doped III-V materials including a dopant in an amount in a range from about $1e^{18}$ to about $1e^{20}$ atoms/$cm^3$ and contacting the epitaxial contacts.

5 Claims, 13 Drawing Sheets

(51) Int. Cl.
    *H01L 29/66*     (2006.01)
    *H01L 21/306*     (2006.01)
    *H01L 29/20*     (2006.01)
    *H01L 29/417*     (2006.01)
    *H01L 29/78*     (2006.01)

(52) U.S. Cl.
    CPC ........ *H01L 29/20* (2013.01); *H01L 29/41791* (2013.01); *H01L 29/66545* (2013.01); *H01L 29/66636* (2013.01); *H01L 29/66795* (2013.01); *H01L 29/785* (2013.01); *H01L 29/7851* (2013.01); *H01L 29/6656* (2013.01); *H01L 29/66522* (2013.01)

(58) Field of Classification Search
    CPC ............... H01L 29/66795; H01L 29/20; H01L 29/1029; H01L 29/0847; H01L 29/7851
    USPC .................................. 438/152, 153, 154, 218
    See application file for complete search history.

(56) References Cited

U.S. PATENT DOCUMENTS

| | | | | |
|---|---|---|---|---|
| 9,147,696 | B2* | 9/2015 | Wan | H01L 27/1211 |
| 9,263,586 | B2* | 2/2016 | Huang | H01L 29/7851 |
| 9,917,195 | B2 | 3/2018 | Cai et al. | |
| 9,935,201 | B2 | 4/2018 | Cai et al. | |
| 2005/0280102 | A1* | 12/2005 | Oh | H01L 29/0847 257/401 |
| 2008/0057712 | A1* | 3/2008 | Liu | H01L 21/31111 438/689 |
| 2008/0285350 | A1* | 11/2008 | Yeh | G11C 16/0466 365/185.17 |
| 2012/0139007 | A1* | 6/2012 | Tatsumura | H01L 29/045 257/192 |
| 2013/0285141 | A1* | 10/2013 | Kuo | H01L 29/66545 257/347 |
| 2014/0145242 | A1* | 5/2014 | Huang | H01L 21/823807 257/192 |
| 2014/0162424 | A1* | 6/2014 | Hung | H01L 29/772 438/300 |
| 2015/0011056 | A1* | 1/2015 | Kapoor | H01L 29/78654 438/163 |
| 2015/0091094 | A1* | 4/2015 | Wan | H01L 27/1211 257/369 |
| 2015/0162405 | A1* | 6/2015 | Yang | H01L 29/1045 257/76 |
| 2015/0221556 | A1* | 8/2015 | Zhang | H01L 21/823431 438/478 |
| 2015/0279974 | A1* | 10/2015 | Godet | H01L 29/66803 438/283 |
| 2015/0295087 | A1* | 10/2015 | Cheng | H01L 29/7851 257/192 |
| 2015/0380412 | A1* | 12/2015 | Huang | H01L 21/823807 257/192 |

OTHER PUBLICATIONS

List of IBM Patents or Patent Applications Treated as Related—Date Filed: Jun. 29, 2016; 1 page.

Cai, Xiuyu, et al.; "High Doped III-V Source/Drain Junctions for Field Effect Transistors"; U.S. Appl. No. 15/890,880, filed Feb. 7, 2018.

List of IBM Patents or Patent Applications Treated as Related—Date Filed: May 15, 2018; 2 pages.

* cited by examiner

US 10,355,086 B2

HIGH DOPED III-V SOURCE/DRAIN JUNCTIONS FOR FIELD EFFECT TRANSISTORS

DOMESTIC PRIORITY

This application is a divisional of and claims priority from U.S. patent application Ser. No. 14/812,425, filed on Jul. 29, 2015, entitled "HIGH DOPED III-V SOURCE/DRAIN JUNCTIONS FOR FIELD EFFECT TRANSISTORS", the entire contents of which are incorporated herein by reference.

BACKGROUND

The present invention generally relates to semiconductor devices, and more specifically, to source-drain contacts in semiconductor devices.

Challenges facing silicon (Si) complementary metal-oxide semiconductor (CMOS) technology has led to using new materials and novel device structures. Semiconducting III-V compounds and materials, e.g., indium-gallium-arsenic (InGaAs) and indium-gallium-antimony (InGaSb), are attractive channel materials in metal-oxide-semiconductor field-effect transistors (MOSFETs) due to their low band gaps and high carrier mobility properties.

The fin-type field effect transistor (FinFET) is a type of MOSFET. The FinFet is a double-gate silicon-on-insulator (SOI) device that mitigates the effects of short channels and reduces drain-induced barrier lowering. The "fin" refers to the narrow channel between source and drain regions. A thin insulating oxide layer on either side of the fin separates the fin from the gate.

SUMMARY

In one embodiment of the present invention, a semiconductor device includes a fin patterned in a substrate; a gate disposed over and substantially perpendicular to the fin; a pair of epitaxial contacts including a III-V material over the fin and on opposing sides of the gate; and a channel region between the pair of epitaxial contacts under the gate comprising an undoped III-V material between doped III-V materials, the doped III-V materials including a dopant in an amount in a range from about $1e^{18}$ to about $1e^{20}$ atoms/cm$^3$ and contacting the epitaxial contacts.

In another embodiment, a method of making a semiconductor device includes depositing a layer of a first doped III-V material onto a substrate, the first doped III-V material including a dopant in an amount in a range from about $1e^{18}$ to about $1e^{20}$ atoms/cm$^3$; patterning a fin in the first doped III-V material and the substrate; forming a gate structure over and substantially perpendicular to the fin; growing by an epitaxial process a pair of epitaxial contacts including a second doped III-V material over the fin and on opposing sides of the gate structure; etching to remove the first doped III-V material from a portion of the channel region beneath the gate structure; filling the portion of channel region with an undoped III-V material to form a channel including the undoped III-V material between remaining portions of the first doped III-V material; and filling the gate structure with a conductive gate metal.

Yet, in another embodiment, a method of making a semiconductor device includes depositing a layer of a doped III-V material onto a substrate, the doped III-V material including a dopant in an amount in a range from about $1e^{18}$ to about $1e^{20}$ atoms/cm$^3$; patterning a fin in the doped III-V material and the substrate; forming a gate structure over and substantially perpendicular to the fin; growing by an epitaxial process a pair of epitaxial contacts including a III-V material over the fin and on opposing sides of the gate; etching to remove the doped III-V material from a portion of a channel region beneath the gate structure; building up the channel region by filling the gate structure and the channel region with an undoped III-V material; performing a timed etching process to remove the undoped III-V material from the gate structure and leave the undoped III-V material between remaining portions of the doped III-V material; and filling the gate structure with a conductive gate metal.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
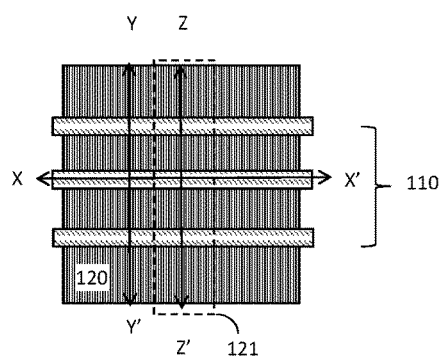
FIG. 1A illustrates a top view of a semiconductor device comprising a gate disposed over fins.

Although FinFETs are more scalable to smaller dimensions than planar MOSFETs, aggressive scaling of fin widths can lead to high series resistance. A sharp and heavily doped junction between the channel region and the source and drain regions is desirable to provide lower resistance in the channel junction.

While a sharp and heavily doped channel junction is desired, there are however strict constraints on the thermal budgets in devices with III-V channels. In particular, ion-implantation and annealing used for forming III-V channels may exceed the allowed temperature. Further, regrowth of highly doped source and drain regions may not reduce the resistance under the gate spacers. Such regrowth processes also may be above the allowed thermal budget on the channel.

Accordingly, embodiments of the present invention provide a semiconductor device and methods for forming devices with a sharp channel junction that provides reduced resistance. Specifically, embodiments of the present invention provide a replacement fin channel approach to form a sharp and heavily doped source and drain contact. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the term "III-V material" means a material or compound including at least one III element and at least one V element.

As used herein, the term "III element" means aluminum (Al), boron (B), gallium (Ga), indium (In), or any combination thereof.

As used herein, the term "V element" means nitrogen (N), phosphorous (P), arsenic (As), antimony (Sb), or any combination thereof.

Turning now to the figures, FIG. 1A is shown for orientation purposes and illustrates an initial top view of a semiconductor gate region 121 to be subsequently disposed over fins 110. The fins 110 are surrounded by shallow trench isolation (STI) regions, described below.

Figure 1B:
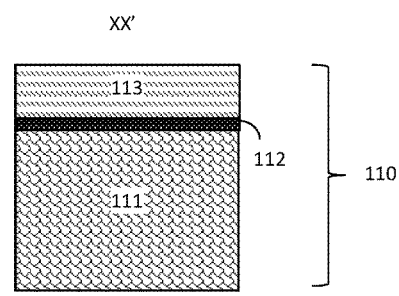
FIGS. 1B, 1C, and 1D illustrate cross-sectional side views through the XX', YY', and ZZ' planes, respectively, of FIG. 1A and show fins patterned in a substrate.
Figure 1C:
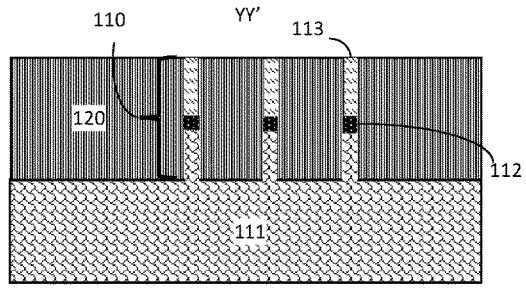
Figure 1D:
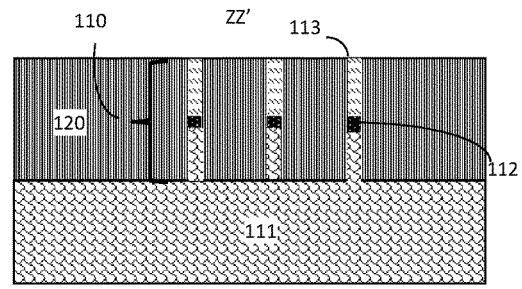

FIGS. 1B, 1C, and 1D illustrate cross-sectional side views through the XX', YY', and ZZ' planes, respectively, of FIG. 1A. FIGS. 1B, 1C, and 1D show the fins 110 patterned in a substrate 111. Note that FIG. 1D looks the same as FIG. 1C upon initial fin 110 and STI region 120 formation, or in the "starting substrate." The substrate 111 includes any suitable substrate material. Non-limiting examples of suitable substrate materials include p-type materials, n-type materials, neutral-type materials, silicon, germanium, gallium silicon, germanium arsenide, silicon germanium, silicon-on-insulator (SOI), or any combination thereof.

The thickness of the substrate 111 is not intended to be limited. In one aspect, the thickness of the substrate 111 is in a range from about 2 to about 5 micrometers (μm). In another aspect, the thickness of the substrate 111 is in a range from about 0.05 μm to about 0.10 μm.

A buffer layer 112 is disposed onto the substrate 111. The buffer layer 112 includes, for example, carbon doped silicon. Other non-limiting examples of suitable materials for the buffer layer 112 include AN, InGaAs, AlGaAs, or any combination thereof. The buffer layer 112 forms a diffusion prevention layer that prevents diffusion of the dopants in heavily doped III-V material layer 113, which is described below. In some embodiments, the buffer layer 112 is optional. When present, the thickness of the buffer layer 112 is in a range from about 100 to about 150 nm. In another aspect, the thickness of the buffer layer 112 is in a range from about 30 to about 50 nm. Yet, in another aspect, the thickness of the buffer layer 112 is about or in any range from about 30, 40, 50, 60, 70, 80, 90, 100, 110, 120, 130, 140, and 150 nm.

A heavily doped III-V material layer 113 is formed over the buffer layer 112, which forms the topmost surface of the fin 110. The heavily doped III-V material layer 113 includes a III-V material. Non-limiting examples of suitable III-V compounds include GaAs, InGaAs, AlGaInP, or any combination thereof.

The III-V material is heavily doped with an n-type dopant (e.g., Group IV or VI elements) or a p-type dopant (e.g., Group II or IV elements), depending on the type of transistor. Doping is performed by an in-situ doping process (not implantation). The III-V material is doped to a dopant concentration in a range from about $1e^{18}$ to about $1e^{19}$ atoms/cm$^3$. In one aspect, the III-V material is doped to a dopant concentration in a range from about $1e^{18}$ to about $1e^{20}$ atoms/cm$^3$.

To form the fins 110, lithography and etching are performed. Lithography can include forming a photoresist (not shown) on the heavily doped III-V material layer 113, exposing the photoresist to a desired pattern of radiation, and then developing the exposed photoresist with a resist developer to provide a patterned photoresist on top of the heavily doped III-V material layer 113. At least one etch is the employed to transfer the pattern from the patterned photoresist through the heavily doped III-V material layer 113, through the buffer layer 112, and partially into the substrate 111. The etching process may be a dry etch (e.g., reactive ion etching, plasma etching, ion beam etching, or laser ablation). The etching process may be a wet chemical etch (e.g., potassium hydroxide (KOH)). Both dry etching and wet chemical etching processes may be used. After transferring the pattern, the patterned photoresist is removed utilizing resist stripping processes, for example, ashing.

A shallow trench isolation (STI) process is performed to form the STI regions. The STI regions 120 are formed by depositing an oxide over the fins 110 and polishing to the top of the heavily doped III-V material layer 113.

Figure 2A:
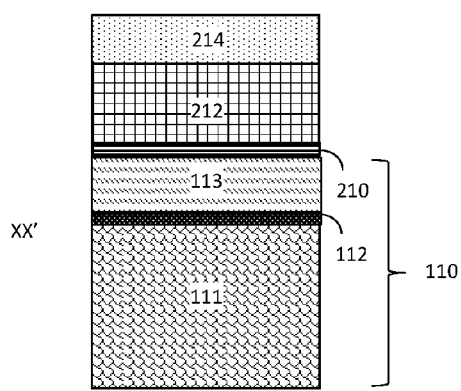
FIGS. 2A, 2B, and 2C are cross-sectional side views through the XX', YY', and ZZ' planes, respectively, after depositing an oxide layer, a removable gate material layer, and a hard mask layer over the fins.
Figure 2B:
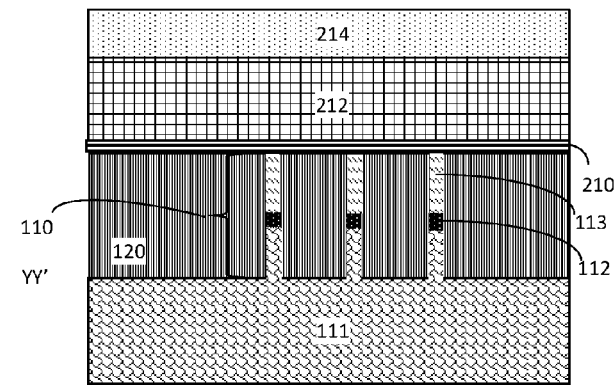
Figure 2C:
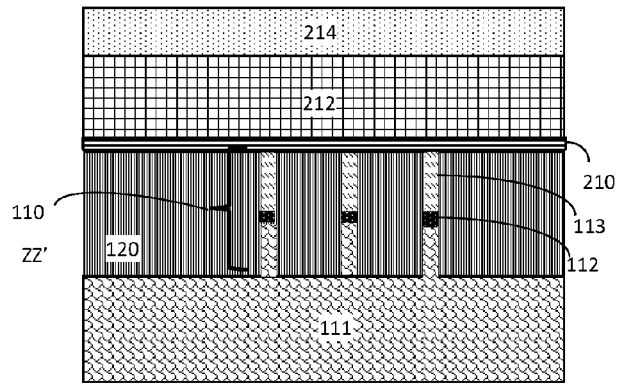
Figure 3A:
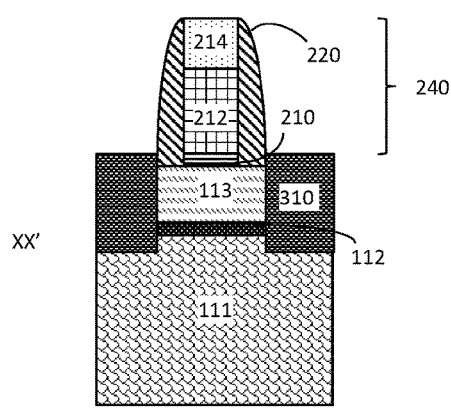
FIGS. 3A, 3B, and 3C are cross-sectional side views through the XX', YY', and ZZ' planes, respectively, after performing an epitaxial growth process to form epitaxial contacts.

FIGS. 2A, 2B, and 2C are cross-sectional side views through the XX', YY', and ZZ' planes, respectively, after depositing an oxide layer 210, a removable gate material layer 212 (e.g., polysilicon/amorphous silicon), and a hard mask layer 214 over the fins 110. The oxide layer 210 and the removable gate material layer 212 will form dummy gates 240 over the fins 110, as shown in FIG. 3A described below.

A non-limiting example of a suitable material for the oxide layer 210 is silicon oxide. The thickness of the oxide layer 210 is not intended to be limited. In one aspect, the thickness of the oxide layer 210 is in a range from about 10 to about 20 nm. In another aspect, the thickness of the oxide layer 210 is about or in any range from about 10, 12, 14, 16, 18, and 20 nm.

Non-limiting examples of suitable materials for the hard mask layer 214 include SiN, SiOCN, SiBCN, or any combination thereof. The thickness of the hard mask layer 214 is not intended to be limited. In one aspect, the thickness of the hard mask layer 214 is in a range from about 30 to about 50 nm. In another aspect, the thickness of the hard mask layer 214 is in a range from about 35 to about 45 nm.

Figures 2D, 2E:
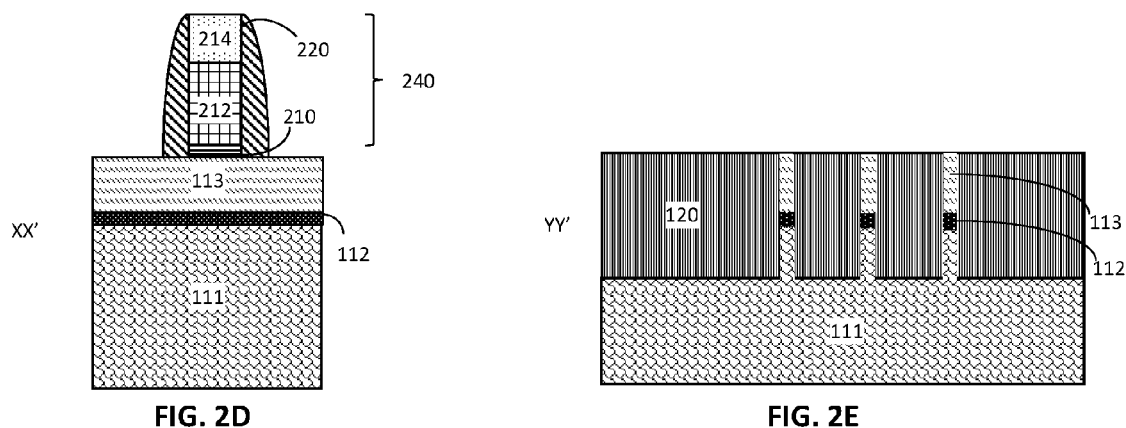
FIGS. 2D, 2E, and 2F are cross-sectional side views through the XX', YY', and ZZ' planes, respectively, after performing a reactive ion etch (ME) process to form a replacement gate with spacers along the gate sidewalls.
Figure 2F:
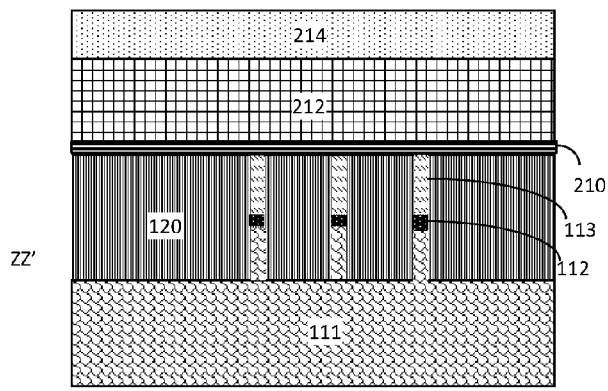

FIGS. 2D, 2E, and 2F are cross-sectional side views through the XX', YY', and ZZ' planes, respectively, after performing a RIE process to form the replacement gate 240. A spacer material is then deposited and etched. The spacer material can be any dielectric spacer material. Non-limiting examples of suitable materials for the spacers 220 include dielectric oxides (e.g., silicon oxide), dielectric nitrides (e.g., silicon nitride), dielectric oxynitrides, or any combination thereof. The spacer material is deposited by a deposition process, for example, chemical vapor deposition (CVD) or physical vapor deposition (PVD). The spacer 220 material may be etched by a dry etch process, for example, a RIE process.

Figure 3B:
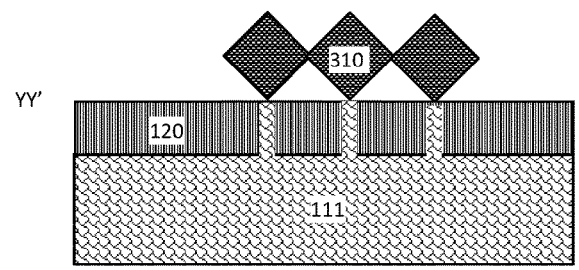
Figure 3C:
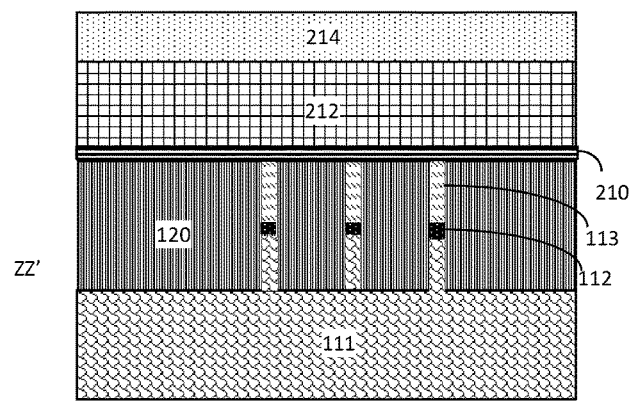

FIGS. 3A, 3B, and 3C are cross-sectional side views through the XX', YY', and ZZ' planes, respectively, after performing an epitaxial growth process to form epitaxial contacts 310 on opposing sides of the replacement gate 240. The epitaxial contacts 310 form the source and drain regions. A wet etching process is performed to selectively remove the STI region 120 material surrounding the fins (see FIG. 3B). Then, a wet etching process is performed to remove the buffer layer 112 and the heavily doped III-V material layer 113 on opposing sides of the replacement gate 240. Etching is performed through the substrate 111 to form recesses where the epitaxial contacts 310 are grown. The epitaxial contacts 310 formed on opposing sides of the replacement gate 240 include a III-V material, which can be the same or different than that of the heavily doped III-V material layer 113 under the dummy gate 240. The III-V materials forming the epitaxial contacts 310 are doped with n-type dopants or p-type dopants as described above for the heavily doped III-V layer 113. The concentration of the dopant in the III-V material of the epitaxial contacts is the same or different than the concentration in the heavily doped III-V material layer 113. In one aspect, the concentration of the dopant is in a range from about $1e^{18}$ to about $1e^{19}$ atoms/cm$^3$. In one aspect, the concentration of the dopant is in a range from about $1e^{18}$ to about $1e^{20}$ atoms/cm$^3$.

Figure 4A:
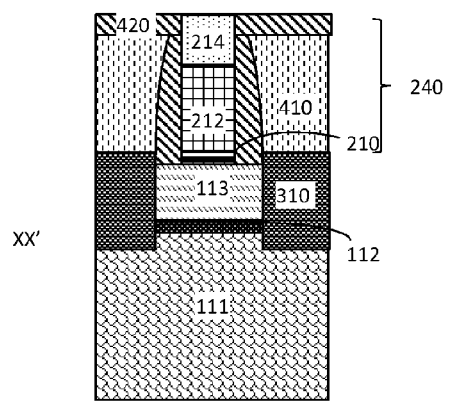
FIGS. 4A, 4B, and 4C are cross-sectional side views through the XX', YY', and ZZ' planes, respectively, after depositing a low-k dielectric oxide layer over the epitaxial contacts.
Figure 4B:
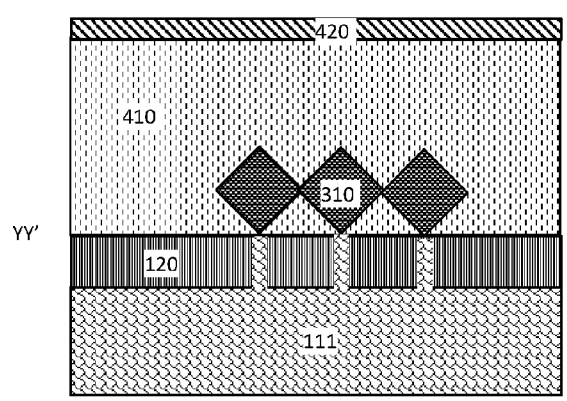
Figure 4C:
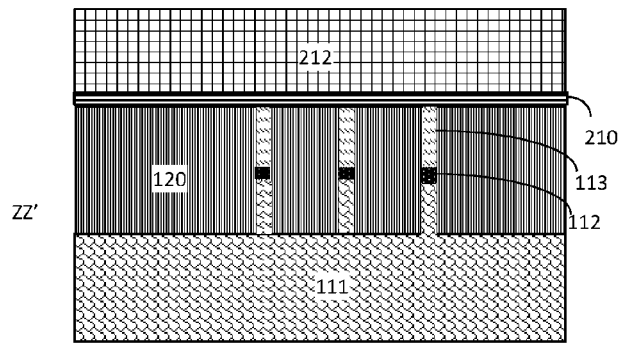

FIGS. 4A, 4B, and 4C are cross-sectional side views through the XX', YY', and ZZ' planes, respectively, after depositing a low-k dielectric oxide layer 410 over the epitaxial contacts 310 and around the replacement gate 240. The low-k dielectric oxide layer 410 can include, but is not limited to, a spin-on-glass, a flowable oxide, a high density plasma oxide, borophosphosilicate glass (BPSG), or any combination thereof. The low-k dielectric oxide layer 410 is deposited by a deposition process, including, but not limited to, molecular beam epitaxy (MBE), CVD, PVD, plasma enhanced CVD, atomic layer deposition (ALD), evaporation, chemical solution deposition, or like processes.

The low-k dielectric oxide layer 410 is planarized, for example, by chemical mechanical planarization (CMP). The thickness of the low-k dielectric oxide layer 410 is not intended to be limited. In one aspect, the thickness of the low-k dielectric oxide layer 410 is in a range from about 70 to about 100 nm. In another aspect, the thickness of the low-k dielectric oxide layer 410 is in a range from about 80 to about 90 nm.

A hard mask layer 420 is deposited onto the low-k dielectric oxide layer 410 and planarized, by, for example, CMP, down to the level of the dummy gate material layer 212. The spacers 220 are also polished away. Non-limiting examples of suitable materials for the hard mask layer 420 include SiN, SiOCN, SiBCN, or any combination thereof. The thickness of the hard mask layer 420 is not intended to be limited. In one aspect, the thickness of the hard mask layer 420 is in a range from about 20 to about 30 nm. In another aspect, the thickness of the hard mask layer 420 is in a range from about 22 to about 28 nm.

Figure 5A:
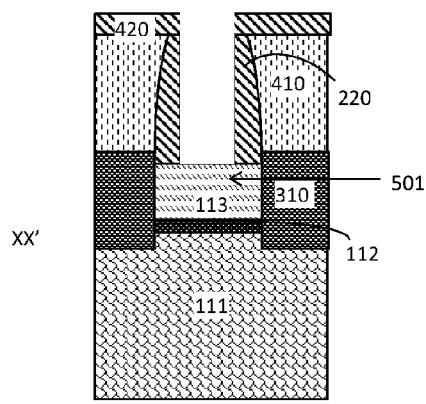
FIGS. 5A, 5B, and 5C are cross-sectional side views through the XX', YY', and ZZ' planes, respectively, after removing the removable gate material.
Figure 5B:
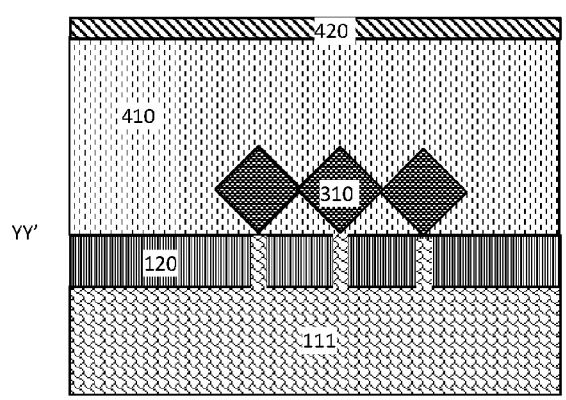
Figure 5C:
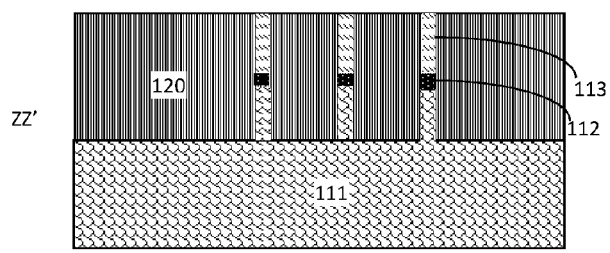

FIGS. 5A, 5B, and 5C are cross-sectional side views through the XX', YY', and ZZ' planes, respectively, after removing the removable gate material layer 212 to exposed the heavily doped III-V material layer 113 in the channel region. A dry etch process is performed to anisotropically remove the gate material. Then a wet etch process is performed to remove the removable gate material layer 212 and buffer layer 210 from between the spacers 220 and expose the channel region 501 beneath the gate.

Figure 5D:
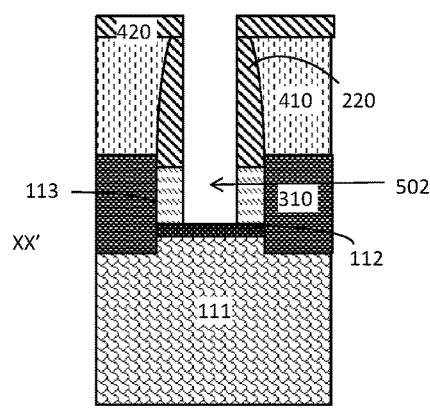
FIGS. 5D, 5E, and 5F are cross-sectional side views through the XX', YY', and ZZ' planes, respectively, after forming a fin recess to expose the buffer layer beneath.
Figure 5E:
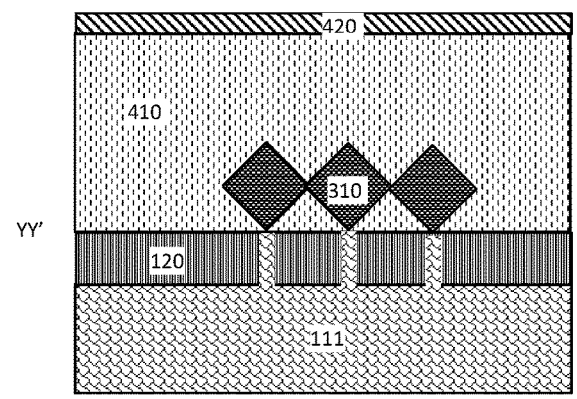
Figure 5F:
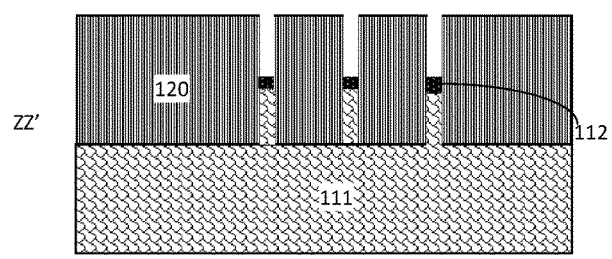

FIGS. 5D, 5E, and 5F are cross-sectional side views through the XX', YY', and ZZ' planes, respectively, after forming a fin recess 502. The fin recess 502 is formed by performing an etching process through the heavily doped III-V material layer 113 in the channel region and down to the buffer layer 112. A dry etching process may be employed, e.g., a dry etch with Cl based etch chemistry. The buffer layer 112 functions as an etch stop and prevents etching through to the substrate 111.

Figure 6A:
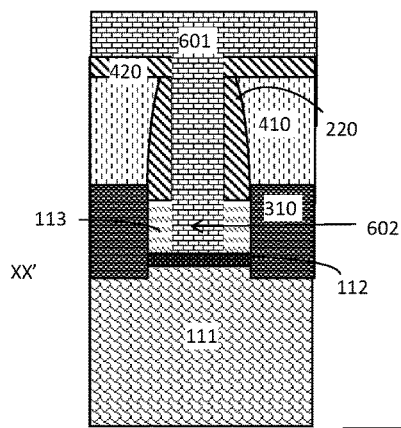
FIGS. 6A, 6B, and 6C are cross-sectional side views through the XX', YY', and ZZ' planes, respectively, after performing a replacement fin growth process.
Figure 6B:
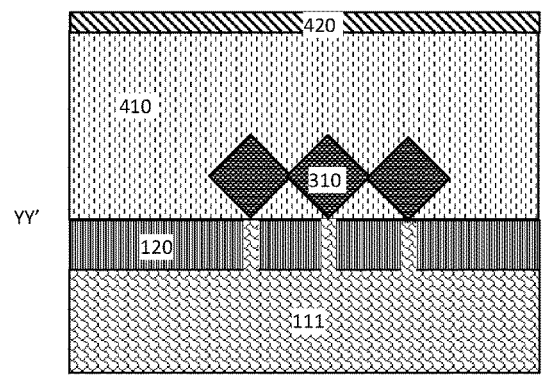
Figure 6C:
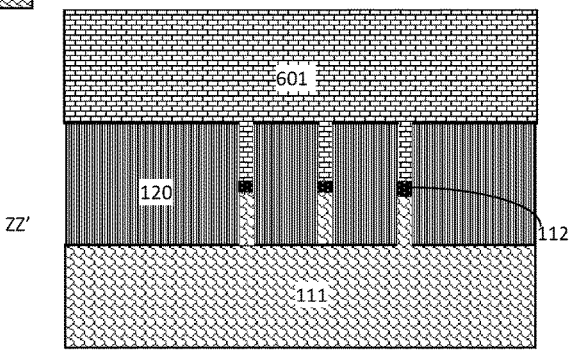

FIGS. 6A, 6B, and 6C are cross-sectional side views through the XX', YY', and ZZ' planes, respectively, after performing a replacement fin growth process. The open gate region and the fins are filled with an undoped III-V material 601, which forms an undoped III-V channel region 602. The undoped III-V material 601 can be the same III-V material as either the highly doped III-V material layer 113 or the epitaxial contacts 310. The undoped III-V material 601 is grown using a metal organic chemical vapor deposition (MOCVD) selective growth process. The buffer layer 112 and the highly doped III-V material layer 113 under the spacers are lattice matched to the undoped III-V channel region 602.

Figure 6D:
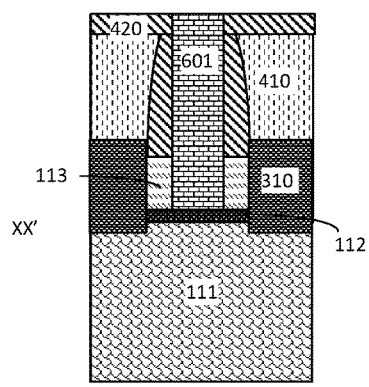
FIGS. 6D, 6E, and 6F are cross-sectional side views through the XX', YY', and ZZ' planes, respectively, after planarizing the replacement fin material.
Figure 6E:
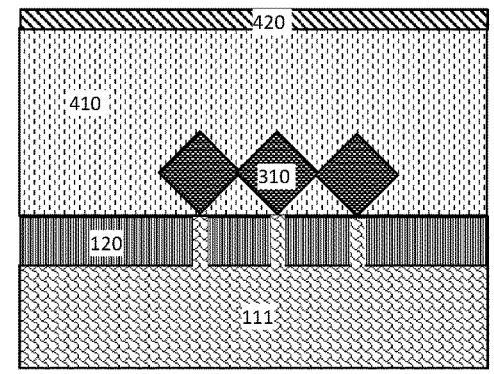
Figure 6F:
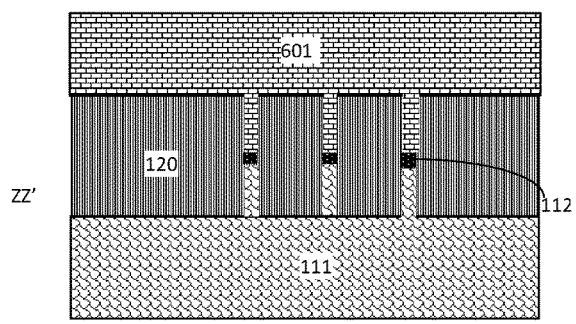

FIGS. 6D, 6E, and 6F are cross-sectional side views through the XX', YY', and ZZ' planes, respectively, after performing a CMP process to planarize the undoped III-V material 601.

Figure 7A:
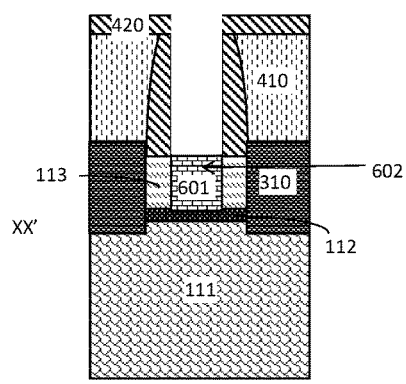
FIGS. 7A, 7B, and 7C are cross-sectional side views through the XX', YY', and ZZ' planes, respectively, after recessing the fins.
Figure 7B:
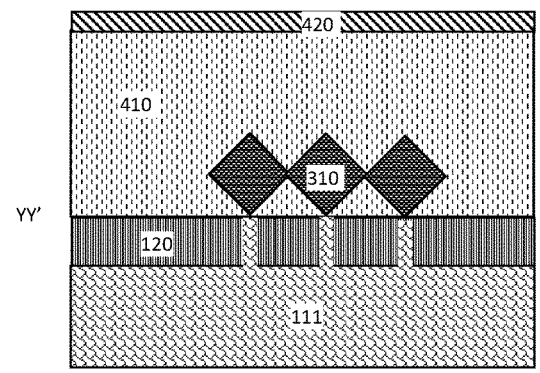
Figure 7C:
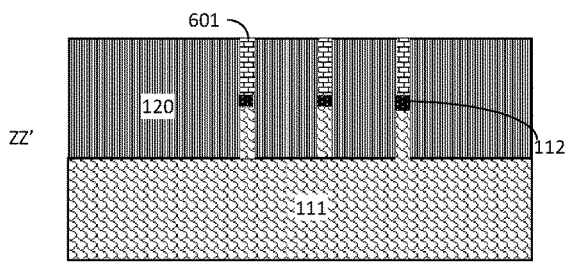

FIGS. 7A, 7B, and 7C are cross-sectional side views through the XX', YY', and ZZ' planes, respectively, after recessing the fins. A dry etching process is performed to remove the undoped III-V material 601 from within the gate structure while leaving the undoped III-V material 601 in the channel region beneath the gate. The dry etching process is timed to provide a suitable channel height. Thus, the resulting channel region 602 includes the undoped III-V material between regions of heavily doped III-V material layers 113.

The thickness of the undoped III-V material 601 in channel region 602 can be tailored and is not intended to be limited. In one aspect, the thickness of the undoped III-V material 601 in the channel region 602 is in a range from about 30 to about 50 nm. In another aspect, the thickness of the undoped III-V material 601 in the channel region 602 is in a range from about 35 to about 45 nm.

Figure 7D:
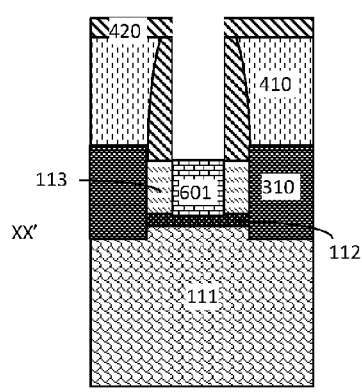
FIGS. 7D, 7E, and 7F are cross-sectional side views through the XX', YY', and ZZ' planes, respectively, after removing surrounding low-k dielectric oxide to expose the final fins.
Figure 7E:
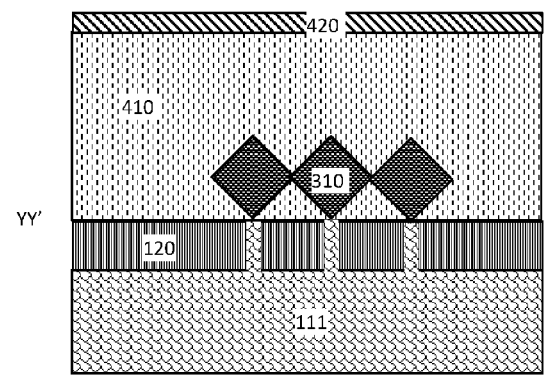
Figure 7F:
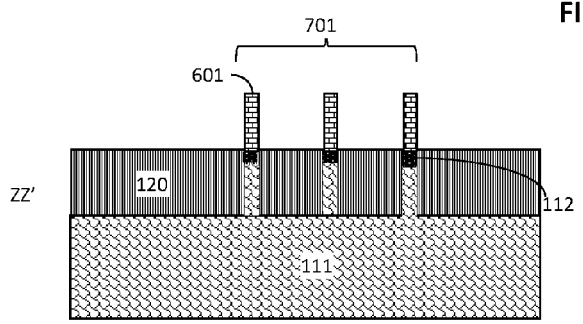

FIGS. 7D, 7E, and 7F are cross-sectional side views through the XX', YY', and ZZ' planes, respectively, after removing the surrounding low-k dielectric oxide layer 120 to expose the final fins 701 beneath the gate. The remaining areas of the final fins 701 remain covered in the hard mask layer 420.

Figure 8A:
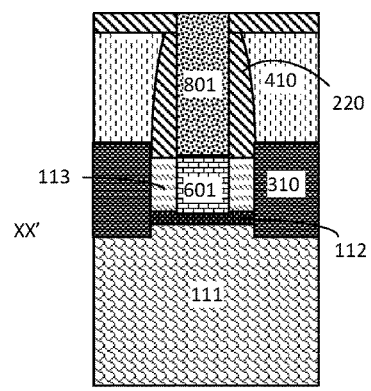
FIGS. 8A, 8B, and 8C are cross-sectional side views though the XX', YY', and ZZ' planes, respectively, after filling the gate with a high-k material and a metal gate material.
Figure 8B:
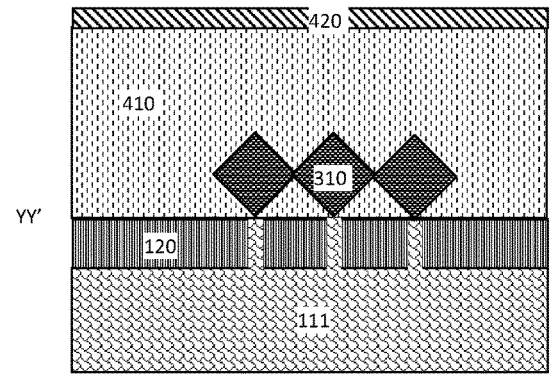
Figure 8C:
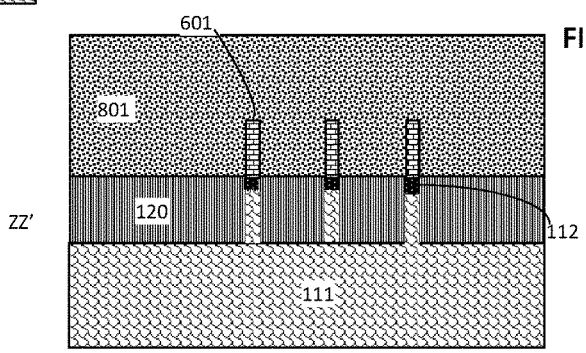
Figure 8D:
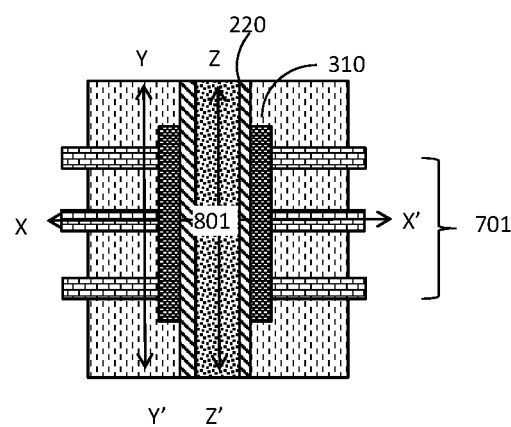
FIG. 8D is a top view of the conductive metal gate disposed over the final fins and channel region.

FIGS. 8A, 8B, and 8C are cross-sectional side views though the XX', YY', and ZZ' planes, respectively, after filling the gate with a high-k material and a metal gate material to form the final high-k metal gate 801. FIG. 8D is a top view of the final gate disposed over the final fins 701 after removing the hard mask layer 420.

The high-k material can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Other non-limiting examples of suitable high-k dielectric materials include $HfO_2$, $ZrO2$, $Al_2O_3$, $TiO_2$, $La_2O_3$, $SrTiO_3$, $LaAlO_3$, $Y_2O_3$, a pervoskite oxide, or any combination thereof. The high-k dielectric material layer may be formed by known deposition processes, for example, MBE, CVD, PECVD, ALD, evaporation, PVD, chemical solution deposition, or other like processes. The thickness of the high-k dielectric material may vary depending on the deposition process as well as the composition and number of high-k dielectric materials used. For example, the high-k dielectric material layer may have a thickness in a range from about 0.5 to about 20 nm.

A conductive metal is deposited over the high-k dielectric material. Non-limiting examples of suitable conductive metals include Al, Pt, Au, W, Ti, or any combination thereof. The conductive metal may be deposited by a known deposition process, for example, CVD, PECVD, PVD, plating, thermal or e-beam evaporation, and sputtering.

As shown in the final structure in FIG. 8A, the channel region is defined by three clearly defined and different regions (the undoped III-V material 601, the heavily doped III-V material layer 113, and the epitaxial contacts 310). The undoped III-V material 601 defines a sharp junction with the heavily doped III-V material layer 113 beneath the spacers 220. The epitaxial contacts 310, which can include the same materials and dopants as the heavily doped material layer 113, provide a structure with a sharply defined boundary at heavily doped source drain regions in a semiconductor structure.

The present invention described above provides a semiconductor device and methods for forming a sharp channel junction that provides reduced resistance. Specifically, the present invention provides a replacement fin channel approach to form a sharp and heavily doped source and drain contact.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:

depositing a layer of a doped III-V material onto a substrate, the doped III-V material comprising a dopant in an amount in a range from about $1e^{18}$ to about $1e^{20}$ atoms/$cm^3$;

patterning a fin in the doped III-V material and the substrate;

forming a gate structure over and substantially perpendicular to the fin;

growing by an epitaxial process a pair of epitaxial contacts comprising a III-V material over the fin and on opposing sides of the gate;

etching to remove the doped III-V material from a portion of a channel region beneath the gate structure;

building up the channel region by filling the gate structure and the channel region with an undoped III-V material;

performing a timed etching process to remove the undoped III-V material from the gate structure and leave the undoped III-V material between remaining portions of the doped III-V material; and filling the gate structure with a conductive gate metal.

2. The method of claim 1, wherein forming the gate structure comprises depositing a removable gate material and a hard mask material over the fin and a reactive ion etch (RIE) process.

3. The method of claim 2, further comprising forming spacers along sidewalls of the gate structure.

4. The method of claim 2, further comprising removing the removable gate material before etching to remove the doped III-V material from a portion of the channel region beneath the gate structure.

5. The method of claim 1, wherein the dopant is a group II, IV, or VI element.

* * * * *